United States Patent
Hang et al.

(10) Patent No.: US 8,227,292 B2
(45) Date of Patent: Jul. 24, 2012

(54) PROCESS FOR THE PRODUCTION OF A MWT SILICON SOLAR CELL

(75) Inventors: Kenneth Warren Hang, Hillsborough, NC (US); Giovanna Laudisio, Bristol (GB); Alistair Graeme Prince, Bedminster (GB); Richard John Sheffield Young, Somerset (GB)

(73) Assignee: E I du Pont de Nemours and Company, Wilmington, DE (US)

( * ) Notice: Subject to any disclaimer, the term of this patent is extended or adjusted under 35 U.S.C. 154(b) by 49 days.

(21) Appl. No.: 12/963,003

(22) Filed: Dec. 8, 2010

(65) Prior Publication Data
US 2011/0139238 A1   Jun. 16, 2011

Related U.S. Application Data

(60) Provisional application No. 61/286,521, filed on Dec. 15, 2009.

(51) Int. Cl.
*H01L 21/00* (2006.01)
*H01L 21/50* (2006.01)
*H01L 21/48* (2006.01)
*H01L 21/44* (2006.01)
*H01L 21/4763* (2006.01)

(52) U.S. Cl. ............ 438/98; 438/71; 438/119; 438/637; 438/928; 257/E21.001; 257/E21.523; 257/E21.577; 257/E21.585

(58) Field of Classification Search ........... 257/E21.001, 257/E21.523, E21.577, E21.585
See application file for complete search history.

(56) References Cited

U.S. PATENT DOCUMENTS

2010/0155874 A1 *   6/2010   Bui et al. .............. 257/461
2010/0176507 A1 *   7/2010   Shiv et al. ............. 257/698

OTHER PUBLICATIONS

Clement et al., "Industrially feasible multi-crystalline metal wrap through (MWT) silicon solar cells exceeding 16% efficiency", Solar Energy Materials & Solar Cells, 2009, pp. 1051-1055, vol. 93.
Preliminary Datasheet Sunweb by Solland Solar.

* cited by examiner

*Primary Examiner* — Mohsen Ahmadi

(57) ABSTRACT

A process for the production of a MWT silicon solar cell comprising the steps:
(1) providing a p-type silicon wafer with (i) holes forming vias between the front-side and the back-side of the wafer and (ii) an n-type emitter extending over the entire front-side and the inside of the holes,
(2) applying a conductive metal paste to the holes of the silicon wafer to provide at least the inside of the holes with a metallization,
(3) drying the applied conductive metal paste, and
(4) firing the dried conductive metal paste, whereby the wafer reaches a peak temperature of 700 to 900° C.,
wherein the conductive metal paste has no or only poor fire-through capability and comprises (a) at least one particulate electrically conductive metal selected from the group consisting of silver, copper and nickel and (b) an organic vehicle.

16 Claims, No Drawings

US 8,227,292 B2

PROCESS FOR THE PRODUCTION OF A MWT SILICON SOLAR CELL

FIELD OF THE INVENTION

The present invention is directed to a process for the production of a MWT (metal-wrap-through) silicon solar cell. The present invention is also directed to the respective MWT silicon solar cells.

TECHNICAL BACKGROUND OF THE INVENTION

The majority of the solar cells currently produced are based upon crystalline silicon.

A conventional solar cell with a p-type (p-doped) silicon base has an n-type (n-doped) emitter in the form of an n-type diffusion layer on its front-side. Such conventional silicon solar cell structure uses a negative electrode to contact the front-side or sun side of the cell, and a positive electrode on the back-side. It is well known that radiation of an appropriate wavelength falling on a p-n junction of a semiconductor body serves as a source of external energy to generate electron-hole pairs in that body. The potential difference that exists at a p-n junction, causes holes and electrons to move across the junction in opposite directions, thereby giving rise to flow of an electric current that is capable of delivering power to an external circuit. Most solar cells are in the form of a silicon wafer that has been metallized, i.e., provided with metal contacts which are electrically conductive. Typically, the front-side metallization is in the form of a so-called H pattern, i.e. in the form of a silver grid cathode comprising thin parallel finger lines (collector lines) and busbars intersecting the finger lines at right angle, whereas the back-side metallization is an aluminum anode in electric connection with silver or silver/aluminum busbars or tabs. The photoelectric current is collected from the front-side busbars and the back-side busbars or tabs.

MWT silicon solar cells are examples of silicon solar cells having another cell design than the conventional silicon solar cells described in the preceding paragraph. MWT silicon solar cells are well-known to the skilled person (cf. for example, F. Clement et al., "Industrially feasible multi-crystalline metal wrap through (MWT) silicon solar cells exceeding 16% efficiency", Solar Energy Materials & Solar Cells 93 (2009), pages 1051-1055). MWT silicon solar cells represent a special type of silicon solar cells; they are back contact cells allowing for less front-side shadowing than standard silicon solar cells. The p-type silicon wafers of MWT silicon solar cells are provided with small holes forming vias between the front- and the back-side of the cell. MWT silicon solar cells have an n-type emitter extending over the entire front-side and the inside of the holes. The n-type emitter is covered with a dielectric passivation layer which serves as an ARC (anti-reflective coating) layer, as is conventional for silicon solar cells. Whereas the n-type emitter extends not only over the entire front-side but also over the inside of the holes, the dielectric passivation layer does not and leaves out the inside of the holes and, optionally, also a narrow rim around the front-edges of the holes. The inside of the holes and, if present, the narrow rim around the front-edges of the holes, i.e. the n-type diffusion layer not covered with the dielectric passivation layer, is provided with a metallization either in the form of a conductive metal layer (open hole) or in the form of a conductive metal plug (hole filled with conductive metal). The metallizations of the holes are typically applied from one or two conductive metal pastes and fired. To avoid misunderstandings, if two different conductive metal pastes are used, they are not applied so as to form a double-layer metallization; rather, one conductive metal paste is applied to the holes from the front-side thereof and the other from the back-side. The metallizations of the holes serve as emitter contacts and form cathodic back contacts of the MWT silicon solar cell. In addition, the front-side of the MWT silicon solar cell is provided with a front-side metallization in the form of thin conductive metal collector lines which are arranged in a pattern typical for MWT silicon solar cells, for-example, in a grid-or web-like pattern or as thin parallel finger lines. The term "pattern typical for MWT silicon solar cells" means that the terminals of the collector lines overlap with the metallizations of the holes and are thus electrically connected therewith. The collector lines are applied from a conductive metal paste having fire-through capability. After drying the collector lines so applied they are fired through the front-side dielectric passivation layer thus making contact with the front surface of the silicon substrate.

SUMMARY OF THE INVENTION

The present invention relates to a process for the production of a MWT silicon solar cell. At the same time the process is a process for the production of cathodic back contacts of a MWT silicon solar cell. The process comprises the steps:
(1) providing a p-type silicon wafer with (i) holes forming vias between the front-side and the back-side of the wafer and (ii) an n-type emitter extending over the entire front-side and the inside of the holes,
(2) applying a conductive metal paste to the holes of the silicon wafer to provide at least the inside of the holes with a metallization,
(3) drying the applied conductive metal paste, and
(4) firing the dried conductive metal paste, whereby the wafer reaches a peak temperature of 700 to 900° C.,
wherein the conductive metal paste has no or only poor fire-through capability and comprises (a) at least one particulate electrically conductive metal selected from the group consisting of silver, copper and nickel and (b) an organic vehicle. Accordingly, the present invention relates also to the so produced MWT silicon solar cells and, respectively, to the so-produced cathodic back contacts thereof.

DETAILED DESCRIPTION OF THE INVENTION

The term "metal paste having fire-through capability" used in the description and the claims means a metal paste which etches and penetrates through (fires through) a passivation or ARC layer during firing thus making electrical contact with the surface of the silicon substrate. It is also true, that a metal paste having poor or even no fire-through capability behaves contrarily; it does not fire through a passivation or ARC layer and makes no electrical contact with the silicon substrate upon firing. To avoid misunderstandings; in this context the term "no electrical contact" shall not be understood absolute; rather, it shall mean that the contact resistivity between fired metal paste and silicon surface exceeds $1.cm^2$, whereas, in case of electrical contact, the contact resistivity between fired metal paste and silicon surface is in the range of 1 to 10 $m\Omega.cm^2$.

The contact resistivity can be measured by TLM (transfer length method). To this end, the following procedure of sample preparation and measurement may be used: A silicon wafer having an ARC or passivation layer (for example, a 75 nm thick $SiN_x$ layer) is screen printed on that layer with the silver paste to be tested in a pattern of parallel lines (for example, 127 μm wide and 6 μm thick lines with a spacing of 2.2 mm between the lines) and is then fired with the wafer reaching a peak temperature of, for example, 800° C. The fired wafer is laser-cutted into 10 mm by 28 mm long strips, where the parallel lines do not touch each other and at least 6 lines are included. The strips are then subject to conventional TLM measurement at 20° C. in the dark. The TLM measurement can be carried out using the device GP 4-Test Pro from GP Solar.

Like the back-side of a conventional silicon solar cell, the back-side of a MWT silicon solar cell is also provided with a back-side metallization in the form of an aluminum anode. This aluminum anode is in electric connection with conductive metal collector back contacts, whereby the aluminum anode as well as the conductive metal collector back contacts are in any case electrically insulated from the metallizations of the holes. The photoelectric current is collected from the cathodic back contacts and the anodic conductive metal collector back contacts of the MWT silicon solar cell.

Similar to the production of a conventional silicon solar cell, the production of a MWT silicon solar cell starts with a p-type silicon substrate in the form of a silicon wafer. Typically, the silicon wafers have a thickness in the range of, for example, 140 to 220 μm and an area in the range of, for example, 150 to 400 cm$^2$. Small holes forming vias between the front- and the back-side of the wafer are applied, typically by laser drilling. The holes so produced are, for example, 30 to 250 μm in diameter, and they are evenly distributed over the wafer. Their number lies in the range of, for example, 10 to 100 per wafer. Then an n-type diffusion layer of the reverse conductivity type is formed by the thermal diffusion of phosphorus (P) or the like. Phosphorus oxychloride ($POCl_3$) is commonly used as the gaseous phosphorus diffusion source, other liquid sources are phosphoric acid and the like. The n-type diffusion layer is formed over the entire front-surface of the silicon substrate including the inside of the holes. The p-n junction is formed where the concentration of the p-type dopant equals the concentration of the n-type dopant. The cells having the p-n junction close to the sun side, have a junction depth between 0.05 and 0.5 μm.

After formation of the diffusion layer excess surface glass is removed from the rest of the surfaces by etching by an acid such as hydrofluoric acid. Typically, a dielectric layer, for example, of $TiO_x$, $SiO_x$, $TiO_x/SiO_x$, $SiN_x$ or, in particular, a dielectric stack of $SiN_x/SiO_x$ is then formed on the front-side n-type diffusion layer leaving out however the inside of the holes and, optionally, also a narrow rim around the front-side edges of the holes. Deposition of the dielectric may be performed, for example, using a process such as plasma CVD (chemical vapor deposition) in the presence of hydrogen or sputtering. The dielectric layer serves as both an ARC and passivation layer for the front-side of the MWT silicon solar cell.

Just like a conventional solar cell structure with a p-type base, MWT silicon solar cells typically have a negative electrode on their front-side and a positive electrode on their back-side. The negative front electrode takes the form of thin conductive collector lines arranged in a pattern typical for MWT silicon solar cells. The thin conductive collector lines are typically applied by screen printing, drying and firing a front-side conductive metal paste (front electrode forming conductive metal paste) on the ARC layer on the front-side of the cell, whereby the terminals of the collector lines overlap with the metallizations of the holes to enable electric connection therewith. Firing is typically carried out in a belt furnace for a period of 1 to 5 minutes with the wafer reaching a peak temperature in the range of 700 to 900° C.

As already mentioned in the preceding paragraph, the holes are provided with metallizations. To this end, the holes themselves are metallized by applying conductive metal paste to the holes, either in the form of a conductive metal layer (open holes) or in the form of conductive metal plugs (holes filled with conductive metal). The metallizations may cover only the inside of the holes or also a narrow rim around the edges of the holes, whereby the narrow rim may be present on the front-side edges of the holes, on the back-side edges of the holes or on both. The metallizations may be applied from one single conductive metal paste. It is also possible to apply the metallizations from two different conductive metal pastes, i.e. one conductive metal paste may be applied to the front-side of the holes and the other to their back-side. After application of the one or two conductive metal pastes it is/they are dried and fired to form emitter contacts and, respectively, cathodic back contacts of the MWT silicon solar cell. Firing is typically carried out in a belt furnace for a period of 1 to 5 minutes with the wafer reaching a peak temperature in the range of 700 to 900° C. The fired metallizations of the holes are in electric connection with the terminals of the thin front-side conductive collector lines.

In addition, a back-side silver or silver/aluminum paste and an aluminum paste are applied, typically screen printed, and successively dried on the back-side of the p-type silicon substrate avoiding any contact with the metallizations of the holes. In other words, the back-side metal pastes are applied ensuring that they stay electrically insulated from the metallizations of the holes prior to as well as after firing. The back-side silver or silver/aluminum paste is applied onto the back-side as anodic back collector contacts, which may take the form of busbars, tabs or evenly distributed contacts. The back-side aluminum paste is then applied in the bare areas slightly overlapping with the silver or silver/aluminum back collector contacts. In some cases, the back-side silver or silver/aluminum paste is applied after the back-side aluminum paste has been applied. Firing is then typically carried out in a belt furnace for a period of 1 to 5 minutes with the wafer reaching a peak temperature in the range of 700 to 900° C. The front cathode, the metallizations of the holes and the back anodes can be fired sequentially or cofired.

The back-side aluminum paste is generally screen printed and dried on the back-side of the silicon wafer. The wafer is fired at a temperature above the melting point of aluminum to form an aluminum-silicon melt at the silicon wafer's back-surface. The so-formed p+ layer is generally called BSF (back surface field) layer. The back-side aluminum paste is transformed by firing from a dried state to an aluminum back anode, whereas the back-side silver or silver/aluminum paste becomes anodic silver or silver/aluminum back collector contacts upon firing. Typically, back-side aluminum paste and back-side silver or silver/aluminum paste are cofired, although sequential firing is also possible. During firing, the boundary between the back-side aluminum and the back-side silver or silver/aluminum assumes an alloy state, and is electrically connected as well. The aluminum electrode accounts for most areas of the back anode; as already mentioned, the silver or silver/aluminum back collector contacts account only for a small area of the back anode. In addition, the front-side conductive metal paste applied as thin collector lines fires through the ARC layer during firing, and is thereby able to electrically contact the front-side n-type emitter.

It has been found that the process of the present invention allows for the production of MWT silicon solar cells with improved electric efficiency. The fired conductive metal paste adheres well to the holes, i.e. the n-type emitter surface of the inside of the holes of the silicon wafer. Good adhesion is important with regard to a long service life of the MWT silicon solar cells.

Without being bound to theory it is believed that the conductive metal paste with its at best poor fire-through capability does not or not significantly damage the n-type emitter when steps (3) and (4) of the process of the present invention are carried out. It is important to avoid or reduce damage of the n-type emitter to avoid shunting characteristics.

In step (1) of the process of the present invention a p-type silicon wafer with (i) holes forming vias between the front-side and the back-side of the wafer and (ii) an n-type emitter extending over the entire front-side and the inside of the holes is provided. The silicon wafer is a mono- or polycrystalline silicon wafer as is conventionally used for the production of silicon solar cells; it has a p-type region, an n-type region and a p-n junction. Typically, the silicon wafer has an ARC layer on its front-side, for example, of $TiO_x$, $SiO_x$, $TiO_x/SiO_x$, $SiN_x$ or, in particular, a dielectric stack of $SiN_x/SiO_x$. If such ARC layer is present, it leaves out the inside of the holes and, optionally, also a narrow rim around the edges of the holes. Such silicon wafers are well known to the skilled person; for brevity reasons reference is expressly made to the section "TECHNICAL BACKGROUND OF THE INVENTION". The silicon wafer may already be provided with the front-side conductive metal collector lines and/or with the back-side metallizations, i.e. an aluminum back anode in electric connection with silver or silver/aluminum back collector contacts, as described above in the section "TECHNICAL BACKGROUND OF THE INVENTION".

In step (2) of the process of the present invention a conductive metal paste having no or only poor fire-through capability and comprising (a) at least one particulate electrically conductive metal selected from the group consisting of silver, copper and nickel and (b) an organic vehicle is applied to the holes of the silicon wafer in order to provide at least the inside of the holes with a metallization.

In a particular embodiment of the process of the present invention, the conductive metal paste comprises as component (c) at least one glass frit selected from the group consisting of (i) lead-free glass frits with a softening point temperature in the range of 550 to 611° C. and containing 11 to 33 wt. % (weight-%) of $SiO_2$, >0 to 7 wt. %, in particular, 5 to 6 wt. % of $Al_2O_3$ and 2 to 10 wt. % of $B_2O_3$ and (ii) lead-containing glass frits with a softening point temperature in the range of 571 to 636° C. and containing 53 to 57 wt. % of PbO, 25 to 29 wt. % of $SiO_2$, 2 to 6 wt. % of $Al_2O_3$ and 6 to 9 wt. % of $B_2O_3$.

In the description and the claims the term "softening point temperature" is used. It shall mean the glass transition temperature, determined by differential thermal analysis DTA at a heating rate of 10 K/min.

The conductive metal paste comprises at least one particulate electrically conductive metal selected from the group consisting of silver, copper and nickel. Preferably, the particulate electrically conductive metal is silver. The particulate silver may be comprised of silver or a silver alloy with one or more other metals like, for example, copper. In case of silver alloys the silver content is, for example, 99.7 to below 100 wt. %. The particulate electrically conductive metal or silver may be uncoated or at least partially coated with a surfactant. The surfactant may be selected from, but is not limited to, stearic acid, palmitic acid, lauric acid, oleic acid, capric acid, myristic acid and linolic acid and salts thereof, for example, ammonium, sodium or potassium salts.

The average particle size of the particulate electrically conductive metal or silver is in the range of, for example, 0.5 to 5 μm. The particulate electrically conductive metal or silver may be present in the conductive metal paste in a proportion of 50 to 92 wt. %, or, in an embodiment, 65 to 84 wt. %, based on total conductive metal paste composition.

In the present description and the claims the term "average particle size" is used. It shall mean the average particle size (mean particle diameter, d50) determined by means of laser scattering.

All statements made in the present description and the claims in relation to average particle sizes relate to average particle sizes of the relevant materials as are present in the conductive metal paste composition.

It is possible to replace a small proportion of the electrically conductive metal selected from the group consisting of silver, copper and nickel by one or more other particulate metals. The proportion of such other particulate metal(s) is, for example, 0 to 10 wt. %, based on the total of particulate metals contained in the conductive metal paste.

The conductive metal paste comprises an organic vehicle. A wide variety of inert viscous materials can be used as organic vehicle. The organic vehicle may be one in which the particulate constituents (particulate metal, glass frit, further optionally present inorganic particulate constituents) are dispersible with an adequate degree of stability. The properties, in particular, the rheological properties, of the organic vehicle may be such that they lend good application properties to the conductive metal paste composition, including: stable dispersion of insoluble solids, appropriate viscosity and thixotropy for application, appropriate wettability of the paste solids, a good drying rate, and good firing properties. The organic vehicle used in the conductive metal paste may be a nonaqueous inert liquid. The organic vehicle may be an organic solvent or an organic solvent mixture; in an embodiment, the organic vehicle may be a solution of organic polymer(s) in organic solvent(s). In an embodiment, the polymer used for this purpose may be ethyl cellulose. Other examples of polymers which may be used alone or in combination include ethylhydroxyethyl cellulose, wood rosin, phenolic resins and poly(meth)acrylates of lower alcohols. Examples of suitable organic solvents comprise ester alcohols and terpenes such as alpha- or beta-terpineol or mixtures thereof with other solvents such as kerosene, dibutylphthalate, diethylene glycol butyl ether, diethylene glycol butyl ether acetate, hexylene glycol and high boiling alcohols. In addition, volatile organic solvents for promoting rapid hardening after application of the conductive metal paste in step (2) of the process of the present invention can be included in the organic vehicle. Various combinations of these and other solvents may be formulated to obtain the viscosity and volatility requirements desired.

The organic vehicle content in the conductive metal paste may be dependent on the method of applying the paste and the kind of organic vehicle used, and it can vary. In an embodiment, it may be from 10 to 45 wt. %, or, in an embodiment, it may be in the range of 12 to 35 wt. %, based on total conductive metal paste composition. The number of 10 to 45 wt. % includes organic solvent(s), possible organic polymer(s) and possible organic additive(s).

The organic solvent content in the conductive metal paste may be in the range of 5 to 25 wt. %, or, in an embodiment, 10 to 20 wt. %, based on total conductive metal paste composition.

The organic polymer(s) may be present in the organic vehicle in a proportion in the range of 0 to 20 wt. %, or, in an embodiment, 5 to 10 wt. %, based on total conductive metal paste composition.

In the particular embodiment of the process of the present invention, the conductive metal paste comprises at least one glass frit selected from the group consisting of (i) lead-free glass frits with a softening point temperature in the range of 550 to 611° C. and containing 11 to 33 wt. % of $SiO_2$, >0 to 7 wt. %, in particular, 5 to 6 wt. % of $Al_2O_3$ and 2 to 10 wt. % of $B_2O_3$ and (ii) lead-containing glass frits with a softening point temperature in the range of 571 to 636° C. and containing 53 to 57 wt. % of PbO, 25 to 29 wt. % of $SiO_2$, 2 to 6 wt. % of $Al_2O_3$ and 6 to 9 wt. % of $B_2O_3$.

In case of the lead-free glass frits of type (i), the weight percentages of $SiO_2$, $Al_2O_3$ and $B_2O_3$ do not total 100 wt.-% and the missing wt.-% are in particular contributed by one or more other oxides, for example, alkali metal oxides like $Na_2O$, alkaline earth metal oxides like MgO and metal oxides like $Bi_2O_3$, $TiO_2$ and ZnO.

The lead-free glass frits of type (i) may contain 40 to 73 wt.-%, in particular 48 to 73 wt.-% of $Bi_2O_3$. The weight percentages of $Bi_2O_3$, $SiO_2$, $Al_2O_3$ and $B_2O_3$ may or may not total 100 wt.-%. In case they do not total 100 wt.-% the missing wt.-% may in particular be contributed by one or more other oxides, for example, alkali metal oxides like $Na_2O$, alkaline earth metal oxides like MgO and metal oxides like $TiO_2$ and ZnO.

In case of the lead-containing glass frits of type (ii), the weight percentages of PbO, $SiO_2$, $Al_2O_3$ and $B_2O_3$ may or may not total 100 wt.-%. In case they do not total 100 wt.-% the missing wt.-% may in particular be contributed by one or more other oxides, for example, alkali metal oxides like $Na_2O$, alkaline earth metal oxides like MgO and metal oxides like $TiO_2$ and ZnO.

In case the conductive metal paste comprises lead-free glass frit of type (i) as well as lead-containing glass frit of type (ii), the ratio between both glass frit types may be any or, in other words, in the range of from >0 to infinity. Preferably, the conductive metal paste as used in the particular embodiment of the process of the present invention comprises no glass frit other than glass frit of type (i) and/or type (ii).

The one or more glass frits selected from the groups (i) and/or (ii) serve as inorganic binder. The average particle size of the glass frit(s) is in the range of, for example, 0.5 to 4 µm. The total content of glass frit selected from the groups (i) and/or (ii) in the conductive metal paste as used in the particular embodiment of the process of the present invention is, for example, 0.25 to 8 wt. %, or, in an embodiment, 0.8 to 3.5 wt. %.

The preparation of the glass frits is well known and consists, for example, in melting together the constituents of the glass, in particular in the form of the oxides of the constituents, and pouring such molten composition into water to form the frit. As is well known in the art, heating may be conducted to a peak temperature in the range of, for example, 1050 to 1250° C. and for a time such that the melt becomes entirely liquid and homogeneous, typically, 0.5 to 1.5 hours.

The glass may be milled in a ball mill with water or inert low viscosity, low boiling point organic liquid to reduce the particle size of the frit and to obtain a frit of substantially uniform size. It may then be settled in water or said organic liquid to separate fines and the supernatant fluid containing the fines may be removed. Other methods of classification may be used as well.

The conductive metal paste may comprise one or more organic additives, for example, surfactants, thickeners, rheology modifiers and stabilizers. The organic additive(s) may be part of the organic vehicle. However, it is also possible to add the organic additive(s) separately when preparing the conductive metal paste. The organic additive(s) may be present in the conductive metal paste in a total proportion of, for example, 0 to 10 wt. %, based on total conductive metal paste composition.

The conductive metal paste used in the process of the present invention is a viscous composition, which may be prepared by mechanically mixing the particulate metal and the glass frit(s) with the organic vehicle. In an embodiment, the manufacturing method power mixing, a dispersion technique that is equivalent to the traditional roll milling, may be used; roll milling or other mixing technique can also be used.

The conductive metal paste can be used as such or may be diluted, for example, by the addition of additional organic solvent(s); accordingly, the weight percentage of all the other constituents of the conductive metal paste may be decreased.

The application viscosity of the conductive metal paste may be 20 to 350 Pa·s when it is measured at a spindle speed of 10 rpm and 25° C. by a utility cup using a Brookfield HBT viscometer and #14 spindle.

The conductive metal paste is applied to the holes of the silicon wafer to provide at least the inside of the holes with a metallization, i.e. to form the metallizations of at least the inside of the holes. The conductive metal paste may be applied in the form of a conductive metal layer (open hole) or in the form of a conductive metal plug (hole filled with conductive metal). The method of conductive metal paste application may be printing, for example, screen printing. The application may be performed from the front-side and/or from the back-side of the holes. The conductive metal paste is applied so as to cover at least the inside of the holes with a metallization; i.e. the conductive metal paste may be applied so as to cover only the inside of the holes or also a narrow rim around the edges of the holes, whereby the narrow rim may be present around the front-side edges of the holes, around the back-side edges of the holes or around both. It is possible to apply an additional second conductive metal paste other than the conductive metal paste applied in step (2) of the process of the present invention; in such case the metallizations of the holes are formed by applying one conductive metal paste from the front-side of the holes and the other from their back-side, wherein the metallization of the inside of the holes is applied from the conductive metal paste without or with only poor fire-through capability used in step (2) of the process of the present invention.

In step (3) of the process of the present invention the conductive metal paste applied in step (2) is dried, for example, for a period of 1 to 100 minutes with the silicon wafer reaching a peak temperature in the range of 100 to 300° C. Drying can be carried out making use of, for example, belt, rotary or stationary driers, in particular, IR (infrared) belt driers.

In step (4) of the process of the present invention the dried conductive metal paste is fired to form the finished metallizations of the holes. These metallizations serve as emitter contacts and cathodic back contacts of the MWT silicon solar cell. The firing of step (4) may be performed, for example, for a period of 1 to 5 minutes with the silicon wafer reaching a peak temperature in the range of 700 to 900° C. The firing can be carried out making use of, for example, single or multi-zone belt furnaces, in particular, multi-zone IR belt furnaces. The firing may happen in an inert gas atmosphere or in the presence of oxygen, for example, in the presence of air. During firing the organic substance including non-volatile organic material and the organic portion not evaporated during the drying may be removed, i.e. burned and/or carbonized, in particular, burned. The organic substance removed during firing includes organic solvent(s), optionally present organic polymer(s) and optionally present organic additive (s). At least in case of the particular embodiment of the process of the present invention there is a further process taking place during firing, namely sintering of glass frit with the particulate electrically conductive metal.

Firing may be performed as so-called cofiring together with a front-side metallization in the form of thin conductive metal collector lines arranged in a pattern typical for MWT silicon solar cells and applied from a conductive metal paste and/or with an aluminum back anode applied from a back-side aluminum paste and/or with silver or silver/aluminum back collector contacts applied from a back-side silver or silver/aluminum paste.

The following examples illustrate the determination of the fire-through capability of silver pastes. The examples show also how the adhesion between fired silver paste and p-type silicon substrate surface was tested, whereby the adhesion test was carried out making use of a conventional sample p-type silicon wafer, because it is not possible to test the adhesion between fired silver paste and the inside of the holes of a MWT silicon solar cell wafer.

EXAMPLES (1) Manufacture of Test Samples (i) Example Silver Pastes 1 to 3:

The compositions of the silver pastes 1 to 3 are displayed in Table 1. The pastes comprise of silver powder (average particle size 2 μm), organic vehicle (polymeric resins and organic solvents) and glass frit (average particle size 8 μm). Table 2 provides composition data of the glass frit type employed.

TABLE 1

| Silver | Composition (wt. %) | | |
| --- | --- | --- | --- |
| Paste | silver powder | organic vehicle | glass frit type |
| 1 | 85.0 | 14.5 | 0.5 of type 1 |
| 2 | 81.0 | 17.0 | 2.0 of type 1 |
| 3 | 86.0 | 9.3 | 4.7 of type 2 |

TABLE 2

| Glass type | Softening point temperature (° C.) | Glass components (wt. %) | | | | | | |
| --- | --- | --- | --- | --- | --- | --- | --- | --- |
| | | $SiO_2$ | $Al_2O_3$ | $B_2O_3$ | PbO | $TiO_2$ | $ZrO_2$ | $Li_2O$ |
| 1 | 573 | 28 | 4.7 | 8.1 | 55.9 | 3.3 | — | — |
| 2 | 438 | 17.8 | 0.2 | 1.9 | 79.5 | — | 0.5 | 0.1 |

(ii) Formation of TLM Samples:

On the front face of Si substrates (200 μm thick multicrystalline silicon wafers of area 243 cm$^2$, p-type (boron) bulk silicon, with an n-type diffused POCl$_3$ emitter, surface texturized with acid, 75 nm thick SiN$_x$ ARC layer on the wafer's emitter applied by CVD) having a 30 μm thick aluminum electrode (screen-printed from PV381 Al composition commercially available from E. I. Du Pont de Nemours and Company) the silver pastes 1-3 were screen-printed as 127 μm wide and 6 μm thick parallel finger lines having a distance of 2.2 mm between each other. The aluminum paste and the silver paste were dried before cofiring.

The printed wafers were then fired in a Despatch furnace at a belt speed of 3000 mm/min with zone temperatures defined as zone 1=500° C., zone 2=525° C., zone 3=550° C., zone 4=600° C., zone 5=925° C. and the final zone set at 890° C., thus the wafers reaching a peak temperature of 800° C.

To produce TLM samples, the fired wafers were subsequently laser scribed and fractured into 10 mm×28 mm TLM samples, where the parallel silver metallization lines did not touch each other. Laser scribing was performed using a 1064 nm infrared laser supplied by Optek.

(iii) Formation of Samples for Adhesion Measurements:

On the front face of non-passivated Si substrates (200 μm thick multicrystalline silicon wafers of area 243 cm$^2$, p-type (boron) bulk silicon, with an n-type diffused POCl$_3$ emitter, surface texturized with acid) the silver pastes 1-3 were screen-printed and dried as 2 mm wide and 25 μm thick busbars.

The printed wafers were then fired in a Despatch furnace at a belt speed of 3000 mm/min with zone temperatures defined as zone 1=500° C., zone 2=525° C., zone 3=550° C., zone 4=600° C., zone 5=925° C. and the final zone set at 890° C., thus the wafers reaching a peak temperature of 800° C.

(2) Test Procedures and Results (i) TLM Measurement:

The TLM samples were measured by placing them into a GP 4-Test Pro instrument available from GP Solar for the purpose of measuring contact resistivity. The measurements were performed at 20° C. with the samples in darkness. The test probes of the apparatus made contact with 6 adjacent fine line silver electrodes of the TLM samples, and the contact resistivity (ρc) was recorded.

(ii) Fired Adhesion Measurement:

For the adhesion test, a commercially available automated solder machine from Semtek (PV Soldering Machine, Model SCB-160) was employed. The solder process involved coating a solder ribbon (62Sn-36Pb-2Ag) with flux (Kester 952S) and applying the force of 10 heated pins to the coated solder ribbon and busbar to induce wetting of the fired silver surface on the silicon substrate, resulting in adhesion between the busbar and ribbon. The heated pins were set to a temperature of 260° C. and the soldering pre-heat plate where the sample of interest was placed was set to 180° C.

Adhesion was measured pulling on the solder ribbon at multiple points along the bus bar at speed of 100 mm/s and angle of 90°. The force to remove the busbar was measured in Newtons (N).

Table 3 presents the measured contact resistivity and average adhesion data.

TABLE 3

| Example | Silver paste | Contact Resistivity ($\Omega \cdot cm^2$) | Average Adhesion (N) |
| --- | --- | --- | --- |
| 1 (according to the invention) | 1 | >364 $\Omega \cdot cm^{2*)}$ | 5.1 ± 1.6 |
| 2 (according to the invention) | 2 | >364 $\Omega \cdot cm^{2*)}$ | 4.8 ± 1.1 |
| 3 (comparative example) | 3 | 1.9 m$\Omega \cdot cm^2$ | 3.1 ± 1.2 |

*)The contact resistivity exceeded the upper measurable limit for the GP 4-Test Pro equipment (>364 $\Omega \cdot cm^2$).

What is claimed is:

1. A process for the production of a MWT silicon solar cell comprising the steps:

(1) providing a p-type silicon wafer with (i) holes forming vias between the front-side and the back-side of the wafer and (ii) an n-type emitter extending over the entire front-side and the inside of the holes, (2) applying a conductive metal paste to the holes of the silicon wafer to provide at least the inside of the holes with a metallization, (3) drying the applied conductive metal paste, and (4) firing the dried conductive metal paste, whereby the wafer reaches a peak temperature of 700 to 900° C., wherein the conductive metal paste has no or only poor fire-through capability and comprises (a) at least one particulate electrically conductive metal selected from the group consisting of silver, copper and nickel and (b) an organic vehicle, wherein the conductive metal paste comprises as component (c) at least one glass frit selected from the group consisting of (i) lead-free glass frits with a softening point temperature in the range of 550 to 611° C. and containing 11 to 33 wt. % of $SiO_2$, >0 to 7 wt. % of $Al_2O_3$ and 2 to 10 wt. % of $B_2O_3$ and (ii) lead-containing glass frits with a softening point temperature in the range of 571 to 636° C. and containing 53 to 57 wt. % of PbO, 25 to 29 wt. % of $SiO_2$, 2 to 6 wt. % of $Al_2O_3$ and 6 to 9 wt. % of $B_2O_3$.

2. The process of claim 1, wherein the p-type silicon wafer has an ARC layer on its front-side that leaves out the inside of the holes.

3. The process of claim 1, wherein the organic vehicle content is from 10 to 45 wt. %, based on total conductive metal paste composition.

4. The process of claim 1, wherein the electrically conductive metal is present in the conductive metal paste in a proportion of 50 to 92 wt. %.

5. The process of claim 1, wherein the electrically conductive metal is silver.

6. The process of claim 1, wherein one or more of the lead-free glass frits contain 40 to 73 wt. % of $Bi_2O_3$.

7. The process of claim 1, wherein the total content of glass frit selected from the group consisting of types (i) and (ii) in the conductive metal paste is 0.25 to 8 wt. %.

8. The process of claim 1, wherein the conductive metal paste is applied as a conductive metal layer or as a conductive metal plug.

9. The process of claim 1, wherein the conductive metal paste is applied by printing.

10. A process for the production of a MWT silicon solar cell comprising the steps:

(1) providing a p-type silicon wafer with (i) holes forming vias between the front-side and the back-side of the wafer and (ii) an n-type emitter extending over the entire front-side and the inside of the holes, (2) applying a conductive metal paste to the holes of the silicon wafer to provide at least the inside of the holes with a metallization, (3) drying the applied conductive metal paste, and (4) firing the dried conductive metal paste, whereby the wafer reaches a peak temperature of 700 to 900° C., wherein the conductive metal paste has no or only poor fire-through capability and comprises (a) at least one particulate electrically conductive metal selected from the group consisting of silver, copper and nickel and (b) an organic vehicle, wherein firing is performed as cofiring together with at least one metal paste selected from the group consisting of (1) a conductive metal paste that has been applied to the front-side to form a front-side metallization in the form of thin conductive metal collector lines arranged in a pattern typical for MWT silicon solar cells, (2) a back-side aluminum paste that has been applied to the back-side to form an aluminum back anode and (3) a back-side silver or silver/aluminum paste that has been applied to the back-side to form silver or silver/aluminum back collector contacts.

11. The process of claim 10, wherein the p-type silicon wafer has an ARC layer on its front-side that leaves out the inside of the holes.

12. The process of claim 10, wherein the organic vehicle content is from 10 to 45 wt. %, based on total conductive metal paste composition.

13. The process of claim 10, wherein the electrically conductive metal is present in the conductive metal paste in a proportion of 50 to 92 wt. %.

14. The process of claim 10, wherein the electrically conductive metal is silver.

15. The process of claim 10, wherein the conductive metal paste is applied as a conductive metal layer or as a conductive metal plug.

16. The process of claim 10, wherein the conductive metal paste is applied by printing.

* * * * *